United States Patent [19]

Alemanni

[11] Patent Number: 4,643,234
[45] Date of Patent: Feb. 17, 1987

[54] APPARATUS TO STRAIGHTEN THE LEADS OF A PIN GRID ARRAY

[75] Inventor: James C. Alemanni, Oceanside, Calif.

[73] Assignee: Alpha Modular Systems, Covina, Calif.

[21] Appl. No.: 775,806

[22] Filed: Sep. 13, 1985

[51] Int. Cl.$^4$ .............................................. B21F 1/02
[52] U.S. Cl. .................................... 140/147; 140/140
[58] Field of Search ............. 140/105, 140, 147, 149; 29/835, 838; 72/383–385

[56] References Cited

U.S. PATENT DOCUMENTS

3,404,712 10/1968 Soverkropp ........................ 140/147
3,520,336 7/1970 Zemek ................................ 140/147

Primary Examiner—Francis S. Husar
Assistant Examiner—Robert Showalter
Attorney, Agent, or Firm—Morland C. Fischer

[57] ABSTRACT

A motor driven apparatus to efficiently and reliably straighten the leads of a pin grid array (PGA) so that the leads are aligned parallel with one another and perpendicular to the flat PGA body. The apparatus includes a nest of parallel knife blades which is mounted for linear travel so as to be either introduced to or retracted from the grid of PGA leads. The nest of knife blades is carried by an oscillator assembly which is adapted to automatically oscillate (i.e. pivot) the blades between respective rows of PGA leads. When the nest of knife blades is introduced to the grid of PGA leads, the back-and-forth oscillations of the knife blades will cause the blades to engage and straighten any bent leads. The PGA is carried by a rotatable table assembly. When the nest of knife blades is retracted from the grid of PGA leads, the table assembly may be automatically rotated (e.g. by 90 degrees) so that the grid of leads is oriented for repeated engagement by the nest of knife blades, whereby bent leads may be reliably straightened, regardless of the angle at which such leads are bent.

17 Claims, 20 Drawing Figures

APPARATUS TO STRAIGHTEN THE LEADS OF A PIN GRID ARRAY

BACKGROUND OF THE INVENTION

1. FIELD OF THE INVENTION

This invention relates to a motor driven apparatus for straightening the leads of a pin grid array in an efficient, economical and reliable manner.

2. PRIOR ART

As will be known to those skilled in the art, a pin grid array (PGA) device has a multiplicity of pin leads which extend perpendicularly outward from a face of a generally planar microelectronic substrate or body. The pin leads are aligned in rows so as to form a pattern or grid, which is sometimes referred to as a rank and file arrangement. The pattern or grid is usually square (i.e. the rows and columns of pin leads extend identical distances across the face of the PGA body. The number of pin leads frequently reaches 100 or more and permits the circuits of the microelectronic body to be electrically interconnected with a utilization device at a suitable electrical receptacle.

During manufacture, testing, shipping, and the like, some of the leads may be undesirably bent so that they no longer extend perpendicularly outward from the face of the PGA body. Because the leads are either bent and/or moved out of alignment with one another, it is extremly difficult to electrically connect the PGA to an electrical receptacle.

It has heretofore been common to manually straighten the bent leads of a PGA. More particularly, a worker using tweezers and a magnifying glass would laboriously straighten the leads, one at a time. Such manual activity is notoriously time consuming, inefficient and, consequently, costly, especially when the leads of a large number of PGA devices are in need of straightening and rearranging in perpendicular alignment with the face of the PGA body. What is more, the leads are often susceptible to damage during the manual handling and lead straightening technique. Damage to one or more leads may require that the entire PGA device be scrapped. Since a PGA device is relatively expensive, the scrapping of a large number of devices will undesirably increase the overall manufacturing costs.

SUMMARY OF THE INVENTION

Briefly, and in general terms, a motor driven apparatus is disclosed by which to reliably and efficiently straighten the leads of a pin grid array (PGA) with minimal expenditures of time and cost and reduced likelihood of PGA damage. A nest of parallel knife blades is pivotally carried by and extended ahead of a knife oscillator assembly. The oscillator assembly is interconnected with a track so as to be adapted for linear travel thereon, whereby the knife blades may be introduced to or retracted from the PGA leads. A motor driven eccentric assembly is also interconnected with the track so as to cause the track to move from side-to-side. The movement of the track causes a corresponding side-to-side oscillation of the knife blade oscillator assembly. The side-to-side oscillation of the oscillator assembly is imparted to the nest of knife blades, whereby to cause the knife blades to oscillate (i.e. rock back and forth). Accordingly, when the oscillator assembly is moved along its track so that the nest of knife blades is introduced to the PGA leads, the back and forth oscillation of the knife blades will automatically straighten any bent leads which are engaged thereby.

The PGA is mounted on a motor driven, rotatable table assembly. The table assembly is positioned adjacent one (e.g. forward) end of the track along which the knife blade oscillator assembly travels. When the knife blade oscillator assembly is moved along its track in a rearward direction away from the table assembly, whereby to retract the nest of knife blades from the PGA leads, the table assembly may be automatically rotated through an angle of 90 degrees. Accordingly, the leads of the PGA can be successively oriented (i.e. rotated) so as to be repeatedly engaged and straightened by the nest of knife blades each time that the knife blade oscillator asesmbly is subsequently moved in a forward direction along its track and to a position adjacent the table assembly.

DESCRIPTION OF THE PREFERRED EMBODIMENT

Figure 1:
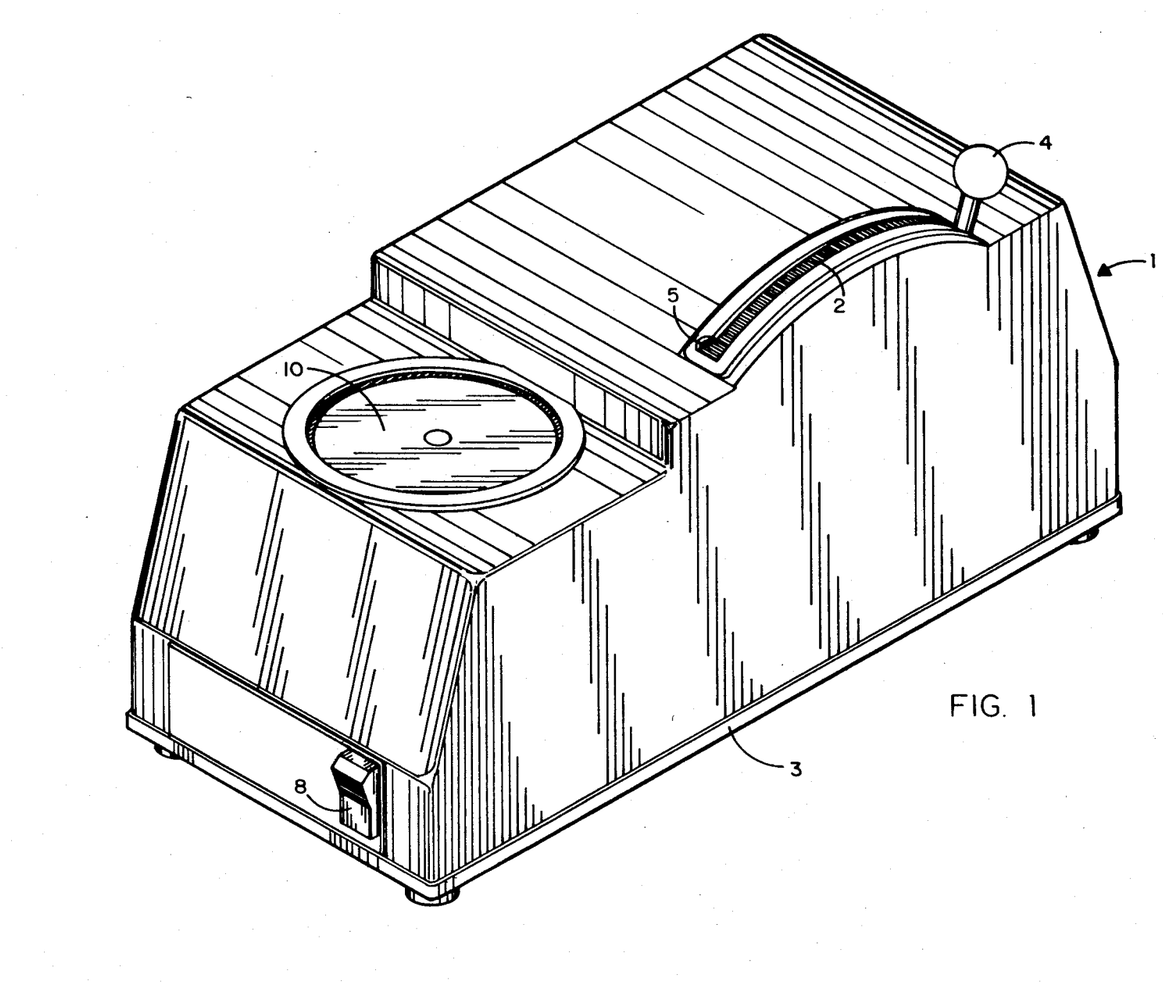
FIG. 1 is a perspective view of the casing of the PGA lead straightening apparatus which forms the present invention.

The lead straightening apparatus which forms the present invention is best described while referring to the drawings. FIG. 1 of the drawings shows a protective casing 1 through which a nest of knife blades is to be moved and oscillated to reliably and efficiently straighten the leads of a pin grid array (PGA). The casing 1 is removably secured to a flat base plate 3. Extending through a slot 2 in the top of casing 1 is a handle 4. Formed at opposite ends of the slot 2 are a pair of notches (i.e. switch positions), only one of which 5 being visible, to which handle 4 may be moved in order to control the operation of the present lead straightening apparatus. The details for moving handle 4 between the switch positions by which to engage respective micro switches and thereby control the straightening of the PGA leads will be disclosed in greater detail hereinafter when referring to FIGS. 17–19.

At the front of casing 1 is a conventional on-off power switch 8. Switch 8 is moved to the on position in order to provide power to the PGA lead straightening apparatus. Extending through an opened area in the top of casing 1 is a rotatable table 10. The table 10 is adapted to variably position a PGA device (not shown) which is mounted thereon so as to be engaged by the nest of knife blades (also not shown) for the purpose of straightening any bent leads of the PGA.

Figure 2:
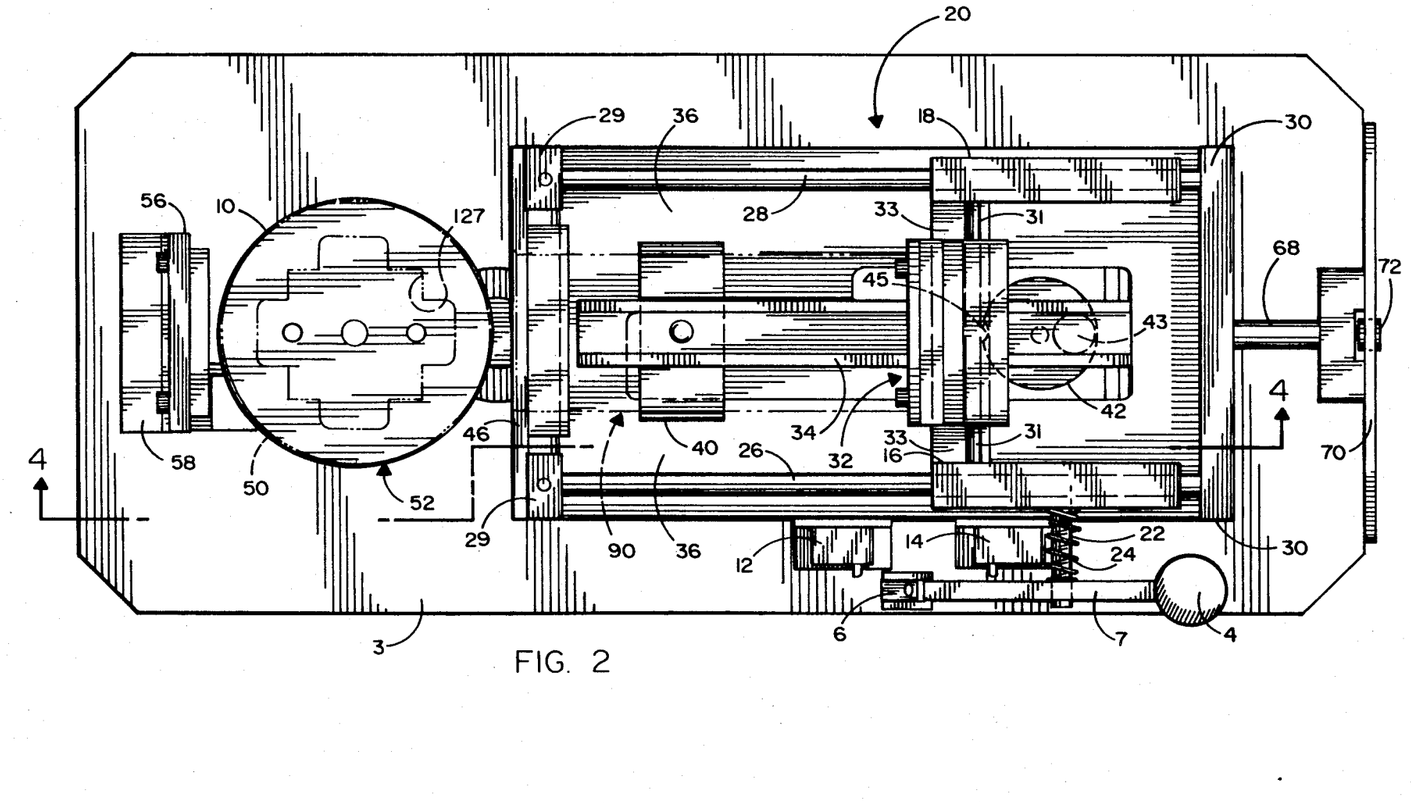
FIG. 2 is a top view of the present PGA lead straightening apparatus with the casing of FIG. 1 removed.
Figure 3:
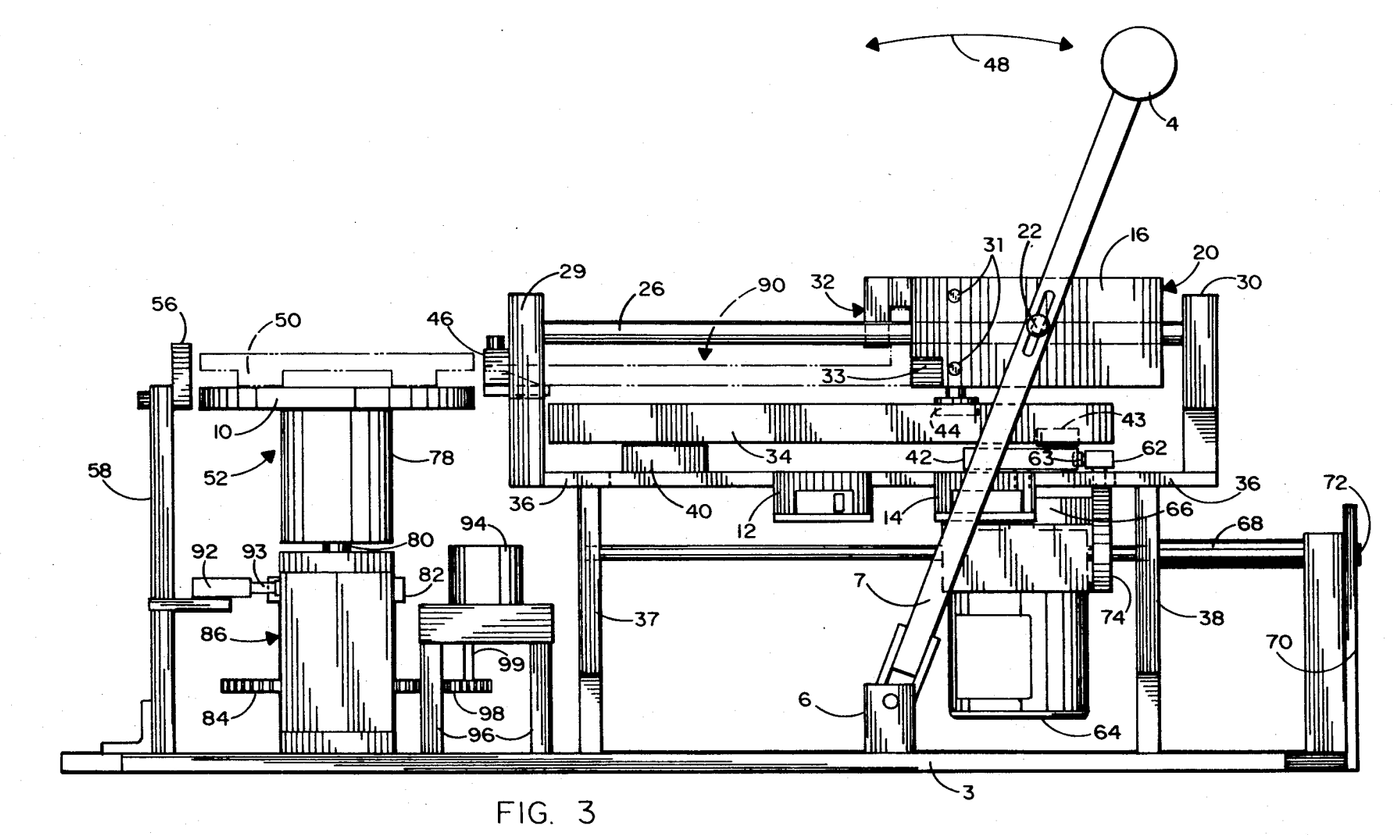
FIG. 3 is a side view of the present PGA lead straightening apparatus with the casing of FIG. 1 removed.
Figure 4:
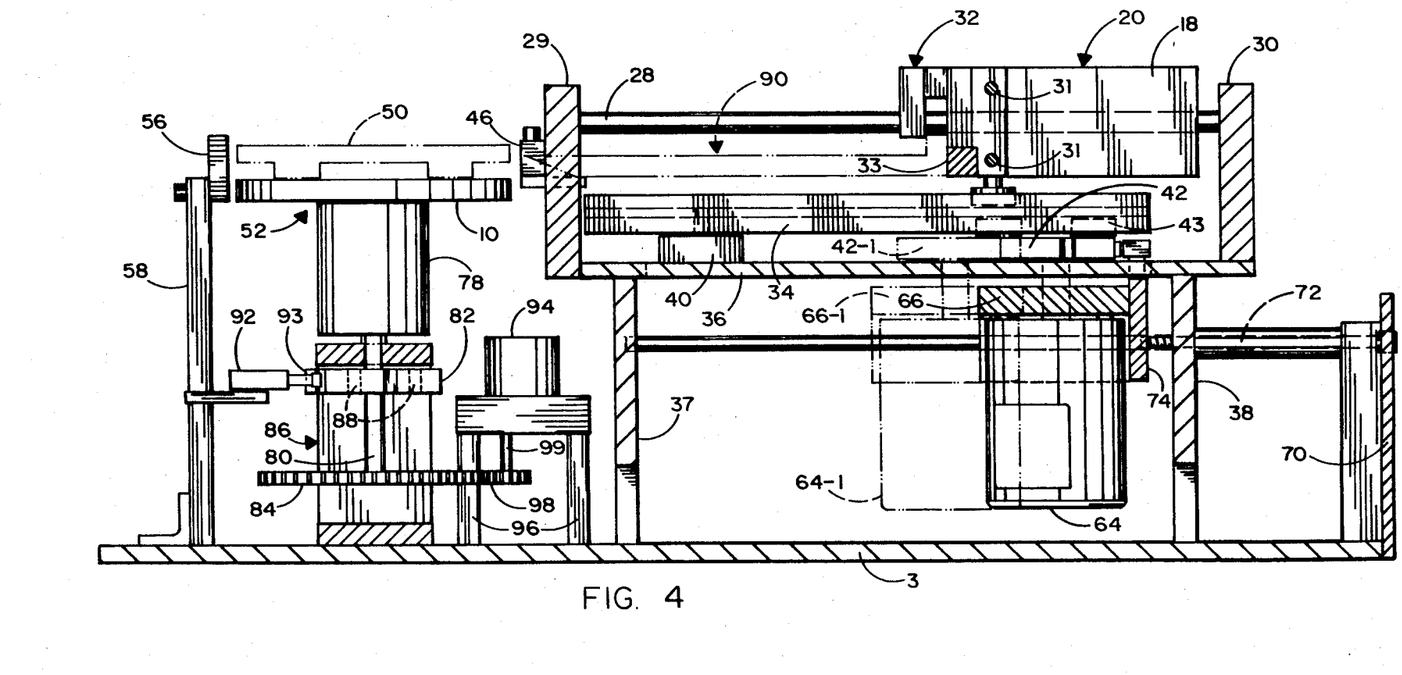
FIG. 4 is a cross-section taken along lines 4—4 of FIG. 2.
Figure 5:
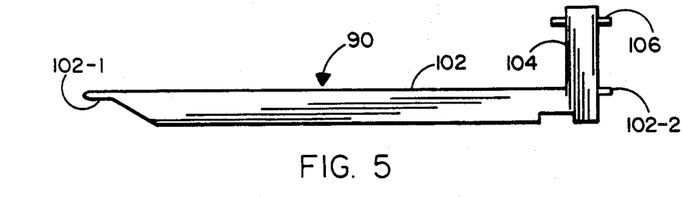
FIG. 5 is a side view of a single knife blade of the present PGA lead straightening apparatus.
Figure 6:
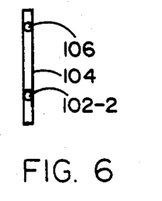
FIG. 6 is an end view of the knife blade of FIG. 5.
Figure 7:
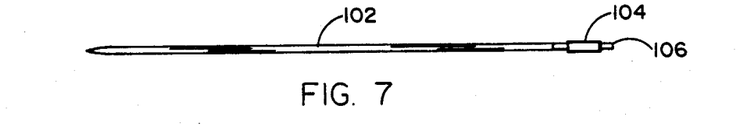
FIG. 7 is a top view of the knife blade of FIG. 5.

Referring concurrently to FIGS. 2–4 of the drawings, the casing 1 of FIG. 1 is removed to expose the interior of the PGA lead straightening apparatus. The handle 4 is shown located adjacent one of a pair of micro switches 12 and 14. Handle 4 is attached via handle bar 7 to a pivotal connection 6 at the base plate 3 so as to be adapted for rotation between micro switches 12 and 14. Handle bar 7 is connected to one side plate 16 of a pair of side plates 16 and 18 which form a movable carriage assembly 20. More particularly, a connecting pin 22 is connected at one end to side plate 16 and at an opposite end through an opening of the handle bar 7. A compression spring 24 fits over connecting pin 22 to spring bias handle bar 7 away from the micro switches 12 and 14. That is, handle 4 may be rotated through an arc around pivotal connection 6 and between micro switches 12 and 14. When handle 4 is located in front of either of the micro switches 12 or 14, handle bar 7 may be moved against the bias of compression spring 24 and into engagement with one of such micro switches to momentarily close the circuit controlled thereby. Inasmuch as handle bar 7 is connected to carriage assembly 20 (by way of connecting pin 22), the rotation of handle 4 causes a corresponding linear movement of carriage assembly 20, the advantage of which will soon be described.

As previously disclosed, carriage assembly 20 includes a pair of side plates 16 and 18. Each side plate 16 and 18 has an opening extending longitudinally therethrough in which to slideably receive a respective carriage rod 26 and 28. Thus, side plates 16 and 18 are adapted to ride back and forth along rods 26 and 28 during the linear movement of carriage assembly 20 in response to the rotation of handle 4. The carriage rods 26 and 28 extend between front and back upwardly extending top support plates 29 and 30 to establish the limits of linear movement for carriage assembly 20. The distance between top support plates 29 and 30 is selected so as to limit the rotational movement of handle 4 to an arc between the micro switches 12 and 14.

Fixedly connected between first ends of side plates 16 and 18 is a stationary pivot support bar 33. Also extending between the first ends of side plates 16 and 18 are a pair of frontal support bars 31. Frontal support bars 31 extend through a knife blade oscillator assembly 32 so as to carry such assembly and permit the side-to-side oscillation thereof between carriage assembly side plates 16 and 18. That is, the oscillator assembly 32 is adapted to slide from side-to-side across the stationary pivot bar 33 and between side plates 16 and 18 for a purpose which will soon be explained.

The details of oscillator assembly 32 will be disclosed when referring hereinafter to FIGS. 9 and 10. Briefly, however, oscillator assembly 32 is carried by frontal support bars 31 so as to slide from side-to-side therealong and be able to ride forwards and backwards with side plates 16 and 18 when the rotation of handle 4 imparts linear motion to carriage assembly 20. In its forward-most position, oscillator assembly 32 is adapted to oscillate a nest of knife blades (shown in phantom and designated reference numeral 90) for the purpose of straightening a plurality of PGA leads when such knife blades are moved into communication therewith.

To facilitate the linear movement of carriage assembly 20 and oscillator assembly 32, a track 34 (e.g. such as that formed from a section of I-shaped channel) is provided over which such assemblies 20 and 32 are adapted to ride. More particularly, a flat support plateform 36 is mounted upon a pair of bottom support plates 37 and 38 which extend upwardly from base plate 3. The aforementioned top support plates 29 and 30 which receive carriage rods 26 and 28 extend upwardly from opposite ends of support platform 36. Connected across support platform 36 is a pivot support block 40. One end of track 34 is pivotally mounted upon pivot support block 40 above support platform 36. Projecting through an opening in support platform 36 is a motor driven eccentric 42. The second end of track 34 is pivotally interfaced with eccentric 42 by means of a pivot 43 which extends from the top of eccentric 42 to the underside of track 34. Thus, opposite ends of track 34 are connected to the pivot support block 40 and eccentric 42, respectively.

Extending downwardly from oscillator assembly 32 is a bearing 44 (best shown in FIGS. 3 and 4). Bearing 44 is slideably received by track 34. Track 34 provides a guide path to accommodate the linear movement of carriage and oscillator assemblies 20 and 32 during such time as when handle 4 is rotated (represented by the direction of arrow 48 in FIG. 3). As will be disclosed in greater detail, the movement of carriage and oscillator assemblies 20 and 32 back and forth along track 34 correspondingly advances and retracts a nest of knife blades 90 through a series of slotted openings formed in an inboard blade support 46 (best shown in FIG. 10). Inboard blade support 46 is connected to the top support plate 29 and located at the forward-most end of the track 34 which forms the guide path for oscillator assembly 32.

Located adjacent the top support plate 29 and the inboard blade support 46 thereof is the rotatable table 10. A nest base (shown in phantom and represented by reference numeral 50) is to be secured to and spaced above table 10 to form a rotatable PGA receiving and rotating assembly 52. An opening 127 is formed in nest base 50 through which to insert the body of a PGA device (not shown), such that the leads of the device project downwardly and into the space between nest base 50 and table 10. As will be described in greater detail hereinafter when referring to FIG. 20, the PGA receiving and rotating assembly 52 is adapted to receive and rotate a PGA so that the leads thereof can be engaged and straightened by a nest of knife blades 90 which are pivotally connected to and extended outwardly from oscillator assembly 32.

Located adjacent PGA receiving and rotating assembly 52 opposite inboard blade support 46 is an outboard blade support 56. Outboard blade support 56 has a series of openings (not shown) formed therein and is connected to an upwardly extending (from base plate 3) bracket 58 to receive the outwardly extended ends of the knife blades 90 when oscillator assembly 32 is moved to its forward-most position along track 34. In the assembled relationship, inboard and outboard blade supports 46 and 56 and nest base 50 are in horizontal alignment with one another so that the back-and-forth linear movement of oscillator assembly 32 along track 34 either advances or withdraws the nest of knife blades 90 past inboard blade support 46, through a plurality of PGA leads and into (or out of) engagement with outboard blade support 56.

The means for driving the present PGA lead straightening apparatus is now described while continuing to refer concurrently to FIGS. 2-4 of the drawings. As previously described, an eccentric 42 is pivotally connected to one end of the track 34 by means of a pivot 43. Eccentric 42 has a disklike configuration with a notch 45 (best shown in FIG. 2) formed therein. A micro switch 62 is located adjacent eccentric 42 so that a flexible switch arm 63 thereof is disposed in communication with the periphery of eccentric 42 (best shown in FIG. 3). The rotation of eccentric 42 is controlled by a motor 64 which is preferably secured to a side motor mount plate 66 below support platform 36 so that a motor shaft projects upwardly through openings in plate 66 and platform 36 to eccentric 42. By way of example, motor 64 is a 115 v/60 Hz. model T stepper motor manufactured by Hurst Manufacturing Corporation of Princeton, Ind.

Micro switch 62 is in a normally opened condition, whereby to disable motor 64 when the switch arm 63 is received in the notch 45 of eccentric 42. The closure of micro switch 12 by handle bar 7 (in a manner which will soon be described) momentarily closes micro switch 62 which thereby causes the energization of motor 64 and a 360 degree rotation of eccentric 42. The rotation of eccentric 42 results in one complete cycle of side-to-side oscillation of track 34. Inasmuch as track 34 is pivotally mounted upon pivot support block 40, the oscillation of track 34 will be imparted to knife blade oscillator assembly 32 when such assembly is moved by handle 4 to a forward position along track 34, at which position switch 12 may be closed to energize motor 64. The side-to-side oscillation of oscillator assembly 32 (i.e. along frontal support bars 31 and between the side plates 16 and 18 of carriage assembly 20) causes a corresponding back and forth oscillation of the nest of knife blades 90 for the purpose of straightening any bent leads of a PGA. At the conclusion of the rotation of eccentric 42, the switch arm 63 of micro switch 62 will again be received in notch 45 to de-energize motor 64 and thereby terminate the oscillation of track 34 and oscillator assembly 32.

Depending upon the characteristics (e.g. thickness, type of material, etc.) of the PGA leads to be straightened, it may be desirable to selectively adjust the angle of oscillation of the nest of knife blades 90. Accordingly, the present lead strightening apparatus is provided with means by which to vary the angle of oscillation which is imparted to knife blade oscillator assembly 32. More particularly, means are provided by which to change the distance between eccentric 42 and pivot support block 40 by relocating eccentric 42 along track 34 to be either closer to or farther from suppor block 40. That is, a hollow bushing 68 extends horizontally between bottom support plate 38 and a rear housing plate 70. An adjusting screw 72 extends through bushing 68 between rear housing plate 70 and a rear motor mount plate 74.

Eccentric 42, motor 64 and the side and rear motor mount plates 66 and 74 are interconnected with one another to form a movable eccentric drive assembly. The eccentric drive assembly is adapted to slide as a unit along the underside of track 34 by means of the pivot 43 (i.e. which extends upwardly from the top of eccentric 42). Therefore, by turning the adjusting screw 72 at the exterior of rear housing plate 70, the position of the slideable eccentric drive assembly relative to the fixed pivot support block 40 can be adjusted via track 34 (best illustrated in FIG. 4 and represented by phantom outlines having reference numerals 42-1, 64-1 and 66-1). Changing the position of the eccentric drive assembly causes a corresponding change in the ratio of distances from the pivot support block 40 to each of the eccentric 42 in one direction and the knife blade oscillator assembly 32 (at its forward-most position along track 34) in an opposite direction. This ratio of distances effects both the angle through which the track 34 is oscillated (i.e. when the rotation of eccentric 42 causes track 34 to pivot around pivot support block 40) and the angle of oscillation which is imparted from track 34 to the nest of knife blades 90 at knife blade oscillator assembly 32.

The drive assembly by which to rotate the PGA receiving and rotating assembly 52 is now described. As previously indicated, receiving and rotating assembly 52 includes a flat table 10 and a nest base 50 which is to removably connected thereto. Table 10 is connected at its underside to a cylindrical mount 78. Cylindrical mount 78 is connected by way of a shaft 80 which extends through the top of a rectangular housing 86 to a cam wheel 82. As is best shown in FIG. 4, the shaft 80 also extends below cam wheel 82 to a sprocket 84. Both cam wheel 82 and sprocket 84 are surrounded by the housing 86. As is also best shown in FIG. 4, the cam wheel 82 has a plurality (e.g. four) of notches 88 uniformly spaced (at 90 degrees) therearound. A micro switch 92 is supported from bracket 58 and located adjacent cam wheel 82 so that a flexible switch arm 93 thereof is disposed in communication with the periphery of cam wheel 82.

The rotation of cam wheel 82 is controlled by a motor 94 which is preferably secured to a motor mount 96 that extends upwardly from base plate 3. By way of example, motor 94 is a 115 v/60 Hz. model A stepper motor manufactured by Hurst Manufacturing Corporation. Motor 94 is adapted to rotate a sprocket 98 which extends below motor 94 by way of a shaft 99. Sprockets 84 and 98 are horizontally aligned so that the respective teeth thereof engage one another, whereby the motor driven sprocket 98 is capable of imparting rotary motion to the sprocket 84 of shaft 80.

Micro switch 92 is in a normally opened condition, whereby to disable motor 94 when the switch arm 93 is received in one of the notches 88 of cam wheel 82. The closure of micro switch 14 by handle bar 7 (in a manner which will soon be described) momentarily closes micro switch 92 which thereby causes the energization of motor 94 and the rotation of sprockets 98 and 84 and, accordingly, cam wheel 82. After a 90 degree rotation of cam wheel 82, the switch arm 93 of micro switch 92 will again be received in a notch 88 to de-energize motor 94 and terminate any further rotation of cam wheel 82. However, a 90 degree rotation of cam wheel 82 results in a corresponding 90 degree rotation of PGA receiving and rotating assembly 52 via shaft 80. Each 90 degree rotation of receiving and rotating assembly 52 is accomplished when knife blade oscillator assembly 32 is moved by handle 4 to a rearward position along track 34, at which position micro switch 14 may be momentarily closed to energize motor 94. The 90 degree rotations of assembly 52 automatically and successively orient the leads of the PGA (not shown) so as to repeatedly be engaged and straightened by the nest of knife blades 90 at such times as when knife blade oscillator assembly 32 is moved by handle 4 to a forward position along track 34 and caused to oscillate back and forth, as previously described.

Figure 8:
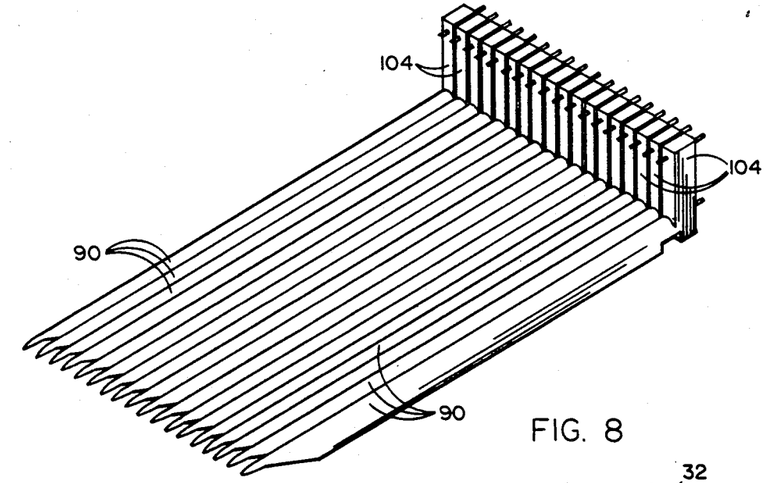
FIG. 8 shows a nest of parallel aligned knife blades.

The details of the knife blades 90 which form a nest for receipt in the knife blade oscillator assembly 32 are now described while referring concurrently to FIGS. 5-8 of the drawings. Each knife blade is formed from tempered (e.g. stainless) steel. Welded across the top of the blade 90 is a wire 102. Wire 102 projects outwardly from opposite ends of blade 90 to form front and rear pivot pins 102-1 and 102-2. Extending upwardly from and co-extensively formed with the rear end of blade 90 is an oscillating arm 104. An oscillating pin 106 extends outwardly and in opposite directions from the top of oscillating arm 104. In FIG. 8, the knife blades 90 are shown nested together and in parallel alignment with one another for receipt by the knife blade oscillator assembly 32 (of FIGS. 9 and 10).

Figure 9:
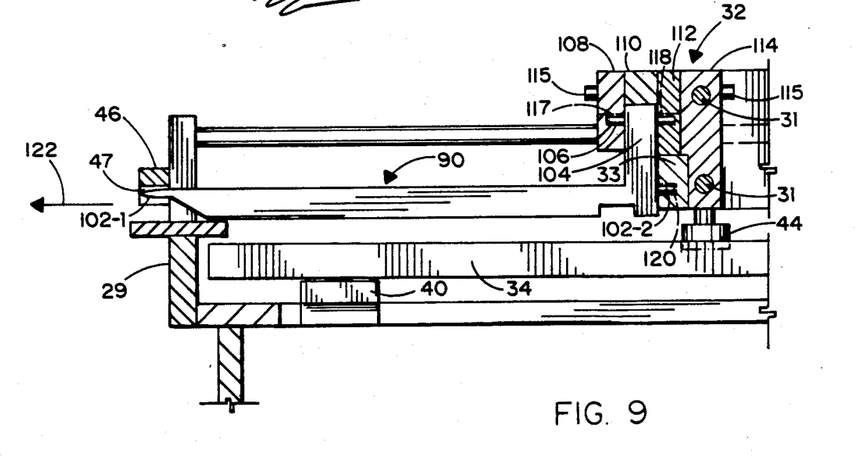
FIG. 9 is a partial cross-section of a knife blade oscillator assembly of the present PGA lead straightening apparatus in which the nest of knife blades of FIG. 8 are carried.
Figure 10:
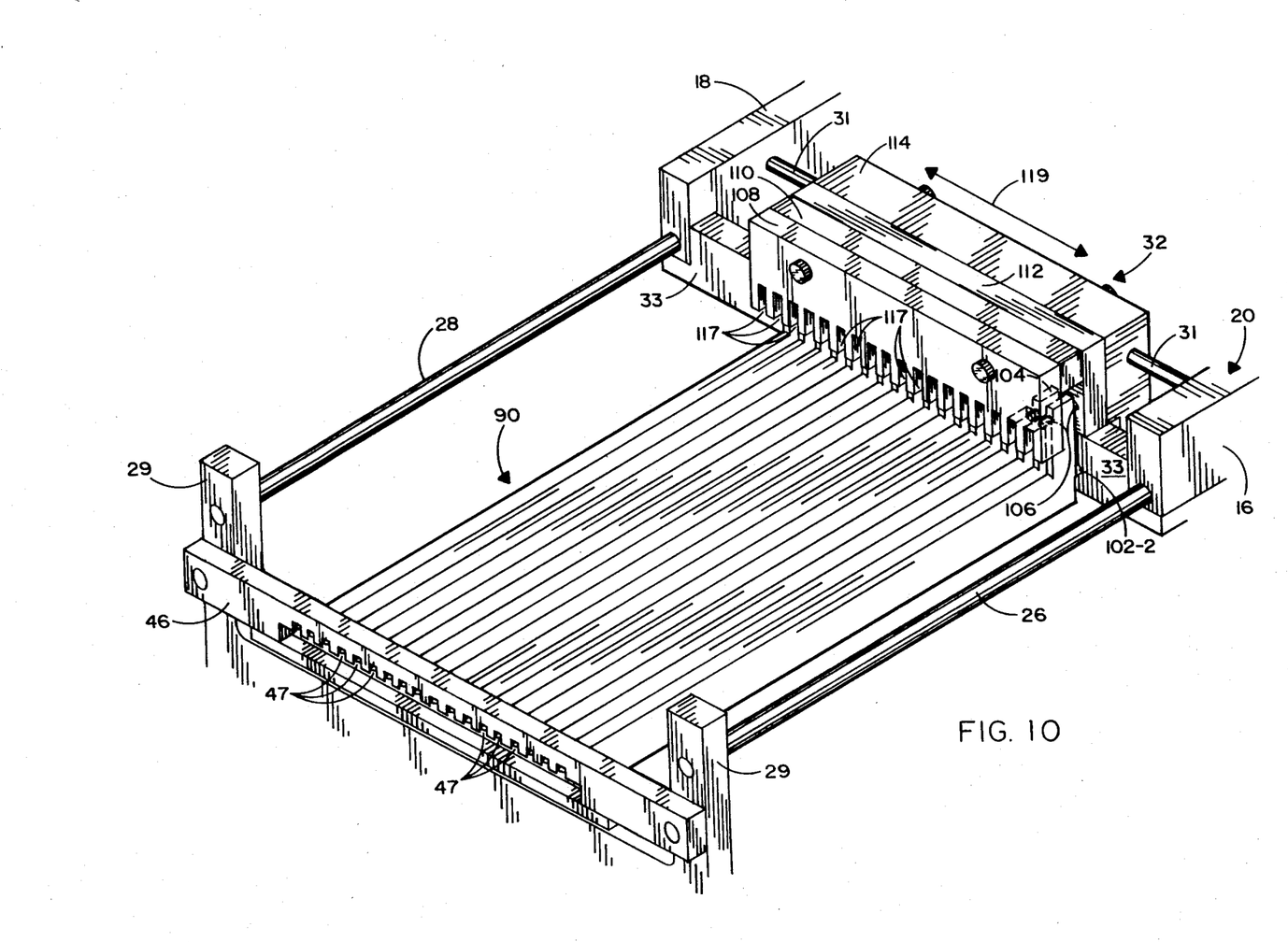
FIG. 10 is a perspective view of the knife blade oscillator assembly and the nest of knife blades carried thereat.

The knife blade oscillator assembly, which was generally described when referring to FIGS. 2-4, is now described in greater detail while referring to FIGS. 9 and 10 of the drawings. Oscillator assembly 32 comprises the face-to-face alignment of a front comb 108, a spacer 110, a rear comb 112 and a rear support block 114. The aforementioned components of oscillator assembly 32 are detachably connected together in the assembled relationship with the nest of knife blades 90 by means of conventional retaining screws 115, or the like.

Each of the front and rear combs 108 and 112 is provided with a series of parallel aligned slots 117 and 118 (best shown in FIG. 10). The nest of knife blades 90 is received by oscillator assembly 32 such that the respective oscillator arms 104 of knife blades 90 are positioned between front and rear combs 108 and 112, and opposite ends of oscillating pin 106 are received through respective slots 117 and 118. The front and rear combs 108 and 112 are separated from one another for the receipt therebetween of oscillating arms 104 by the spacer block 110.

As was previously disclosed, oscillator assembly 32 is carried by support bars 31 and adapted to slide therealong (in the directions of arrows 119 of FIG. 10) and across the stationary pivot support bar 33 between the side plates 16 and 18 of the carriage assembly 20. A series of horizontally aligned holes 120 is formed across pivot support bar 33. The holes 120 are arranged below respective ones of the slots 118 formed in rear comb 112. In the assembled relationship, the front pivot pins 102-1 of knife blades 90 are to be rotatably received through the openings (not shown) in the outboard blade support 56 (best shown in FIGS. 2-4), and the rear pivot pins 102-2 are rotatably received by the holes 120 of pivot support bar 33. Inasmuch as the oscillating pins 106 of oscillator arms 104 are received in the slots 117 and 118 of oscillator assembly 32, the side-to-side movement of oscillator assembly 32 (in the directions of arrows 119) relative to the stationary pivot support bar 33 (during such times as when the track 34 oscillates over pivot support block 40) causes the knife blades 90 to rock back and forth, to thereby pivot around pivot pins 102-1 and 102-2. Accordingly, the knife blades 90 will oscillate (best illustrated in FIG. 12) for the purpose of straightening the leads of a PGA. Of course, and as was also previously disclosed, the oscillator assembly 32 must first be advanced in a forward direction (as indicated by the arrow 122 of FIG. 9) along track 34 so as to extend the nest of knife blades 90 past the slots 47 of inboard blade support 46, between the rows of PGA leads, and into receipt by the openings of the outboard blade support 56.

Figure 11:
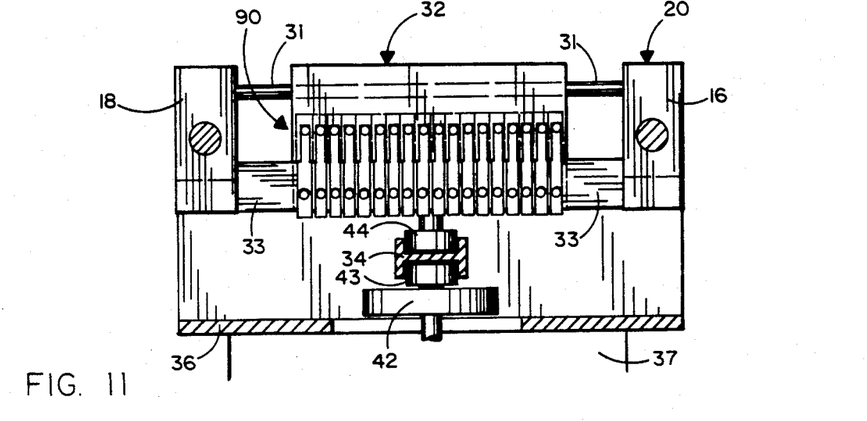
FIG. 11 shows the nest of knife blades of FIG. 8 retained in stationary, upright alignment by the knife blade oscillator assembly.
Figure 12:
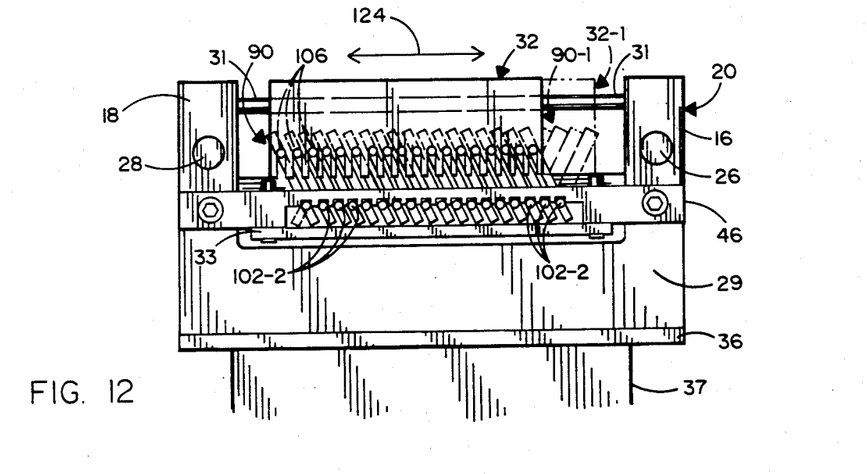
FIG. 12 shows the nest of knife blades being oscillated (i.e. pivoted) by the knife blade oscillator assembly.

The oscillation of the nest of knife blades 90 to straighten the PGA leads is best understood while referring to FIGS. 11 and 12 of the drawings. FIG. 11 shows knife blade oscillator assembly 32 in its rear-most position along track 34 prior to the time that the associated nest of knife blades 90 is caused to oscillate. Thus, each of the knife blades 90 is initially arranged in upright alignment with one another, and oscillator assembly 32 is positioned on frontal support bars 31 an equal distance from each of the side plates 16 and 18 of carriage assembly 20.

FIG. 12 shows the knife blade oscillator assembly 32 moved to its forward-most position along track 34 and immediately behind inboard blade support 46 during the oscillation of the nest of knife blades 90. More particularly, and inasmuch as eccentric 42 is interconnected with track 34 (by means of pivot 43), a 360 degree rotation of eccentric 42 results in one complete cycle of side-to-side oscillation of track 34. Inasmuch as track 34 is interconnected with knife blade oscillator assembly 32 (by means of bearing 44), the oscillation of track 34 will impart corresponding oscillatory movement of the oscillator assembly 32. Accordingly, and as earlier described, the oscillator assembly 32 will slide along frontal support bars 31 and across the stationary pivot support bar 33 (in the direction indicated by arrows 124) between the side plates 16 and 18 of carriage assembly 20. The side-to-side movement of oscillator assembly 32 between side plates 16 and 18 is depicted by phantom lines and designated reference numeral 321.

Inasmuch as knife blade oscillator assembly 32 oscillates from side-to-side (in the direction of arrow 124) relative to the stationary pivot support bar 33, the nest of knife blades 90 (which is retained between the front and rear combs 108 and 112 of assembly 32 in FIGS. 9 and 10) is caused to rock back and forth so as to oscillate (as is depicted in FIG. 12 by phantom lines and designated reference numeral 90-1). That is, the oscillation of oscillator assembly 32 and the corresponding side-to-side movement of oscillating pins 106 causes knife blades 90 to rotate around their respective pivot pins 102-2 (and 102-1, not shown). The knife blades 90 will undergo one complete cycle of oscillation during the aforementioned side-to-side movement of oscillator assembly 32. Hence, the leads of a PGA can be straightened when the knife blade oscillator assembly 32 is advanced to a forward position along track 34, whereby the nest of knife blades 90 will be moved into engagement with such leads.

Figure 13:
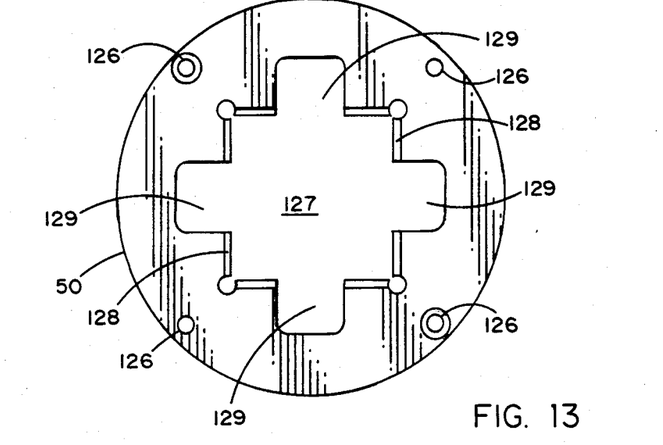
FIG. 13 is a top view of a rotatable nest base of the present PGA lead straightening apparatus for receiving the body of a PGA device.

Details of the nest base 50 from PGA receiving and rotating assembly 52 (of FIGS. 2-4) is now described while referring concurrently to FIGS. 13-16 of the drawings. Nest base 50 is preferably fabricated from a plated metallic material. As is best shown in FIG. 13, the top of nest base 50 is generally flat. A plurality of (e.g. four) legs 125 extends downwardly from nest base 50. A corresponding plurality of holes 126 extend through the legs 125 of nest base 50 for receiving fastening means therethrough by which to secure nest base 50 above the rotatable table (designated 10 in FIGS. 2-4). A rectangular central opening 127 is formed through nest base 50. Surrounding the central opening 127 is a lip 128. The central opening 127 is dimensioned to receive therein a PGA 140 (of FIG. 15), so that the body of the PGA is retained against the lip 128 and the leads of the PGA which are to be straightened are directed downwardly through opening 127 and into the space between PGA 140 and the table. Extending outwardly from and uniformly spaced around opening 127 are a plurality of (e.g. four) access ports 129. Access ports 129 are suitably sized to receive a tool by which to engage and remove a PGA 140 that has been located within central opening 127 so that the leads thereof can be straightened by the present lead straightening apparatus.

Figure 14:
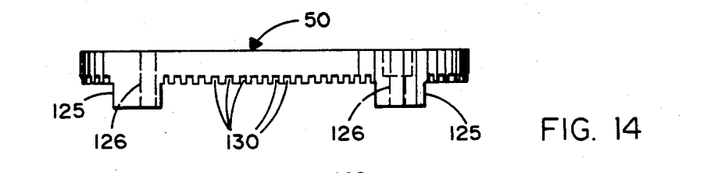
FIG. 14 is a side view of the PGA nest base of FIG. 13.
Figure 15:
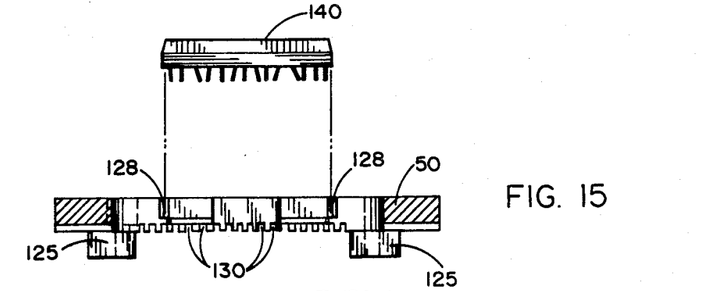
FIG. 15 is a partial cross-section of the nest base of FIG. 13 showing its receipt of a PGA device having bent leads.
Figure 16:
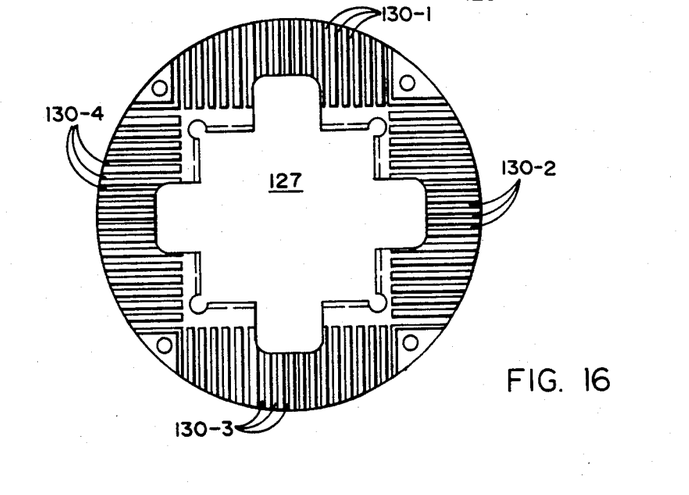
FIG. 16 is a bottom view of the PGA nest base of FIG. 13.

As is best shown in FIGS. 14-16, the bottom of nest base 50 is provided with four sets of alignment grooves 130-1, 130-2, 130-3 and 130-4. Alignment grooves 130-1 and 130-3 are perpendicularly aligned with alignment grooves 130-2 and 130-4. When in the assembled relationship with the rotating table 10, the alignment grooves 130 of nest base 50 provide guide paths to facilitate the introduction or retraction of the nest of knife blades past central opening 127 and into and out of communication with the leads of PGA 140 as the knife blade oscillator assembly 32 is moved along its track.

As will now be described in detail, alignment grooves 130-1 and 130-3 are positioned to receive the nest of knife blades when the nest base 50 is rotated through angles of 0 and 180 degrees. Alignment grooves 130-2 and 130-4 are positioned to receive the nest of knife blades when the nest base 50 is rotated through angles of 90 and 270 degrees. Accordingly, the number of alignment grooves 130-1, 130-2, 130-3 and 130-4 which forms each set thereof corresponds to the number of knife blades 90 which are nested together at oscillator assembly 32.

Figure 17:
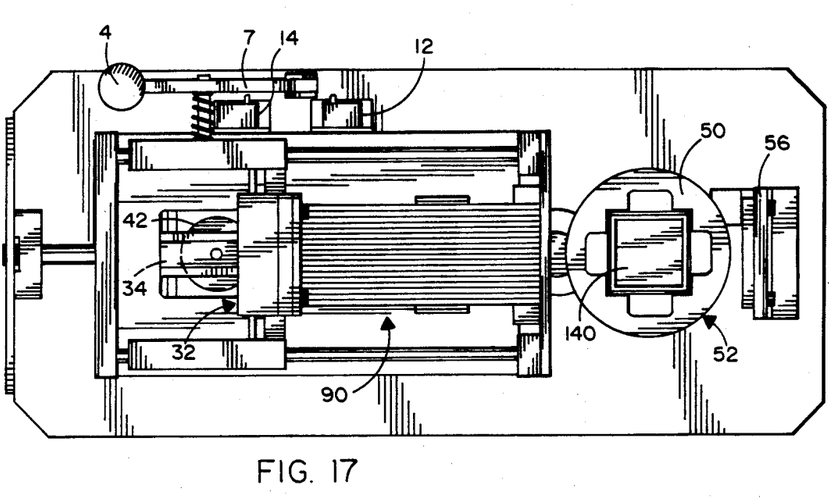
FIGS. 17, 18 and 19 illustrate the operation of the present PGA lead straightening apparatus.
Figure 18:
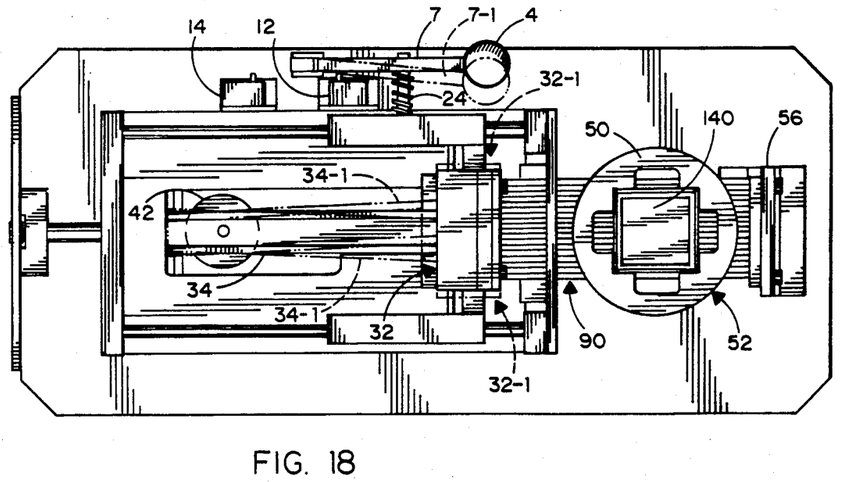
Figure 19:
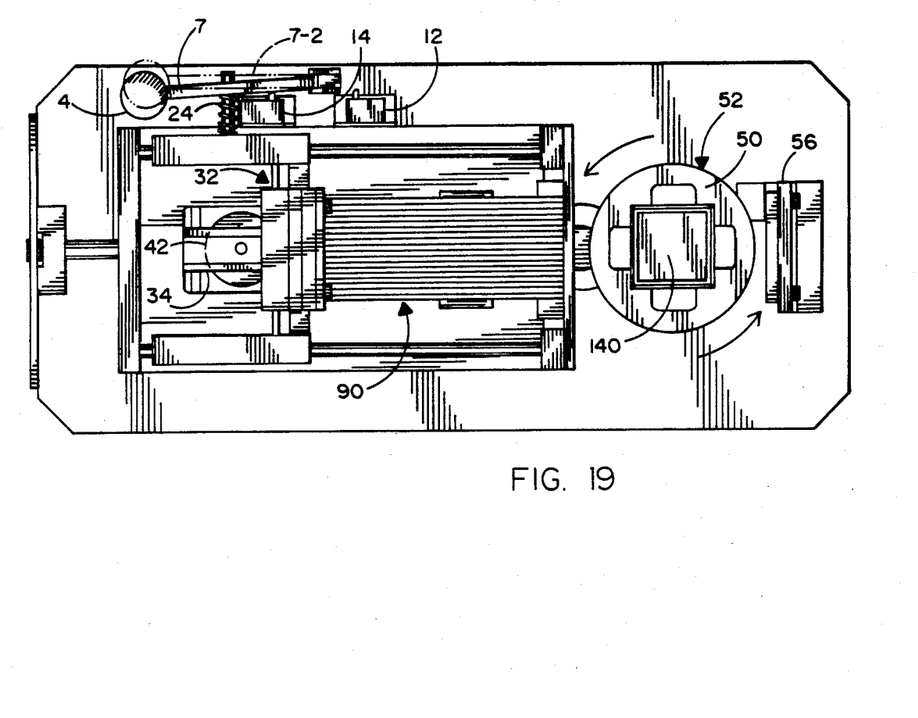

The operation of the presently disclosed apparatus for reliably and efficiently straightening the leads of PGA 140 is now described while referring concurrently to FIGS. 17-19 of the drawings. In FIG. 17, a PGA 140 is initially located within the central opening of nest base 50 of PGA receiving and rotating assembly 52 while the lead straightening apparatus is at rest. That is, the handle 4 is disposed so that the knife blade oscillator asembly 32 is located at its rear-most position along track 34, and the nest of knife blades 90 is completely withdrawn from receiving and rotating assembly 52.

Figure 20:
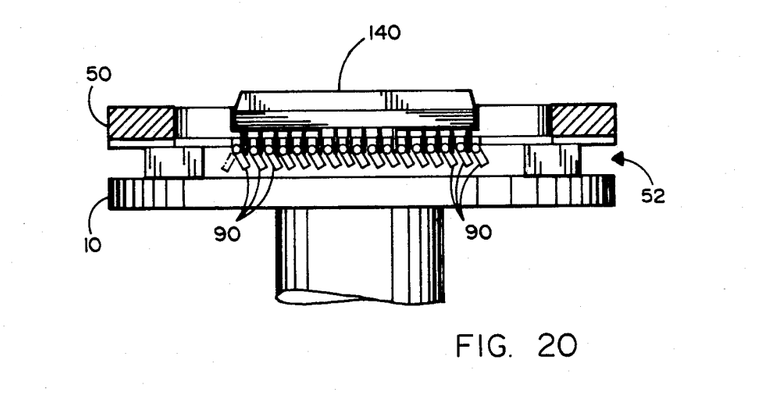
FIG. 20 shows a PGA device received at the rotatable nest base of FIG. 13 for rotation by a PGA receiving and rotating assembly of the present PGA lead straightening apparatus.

In FIG. 18, the handle 4 is rotated so that the knife blade oscillator assembly 32 slides to its forward-most position along track 34, and the nest of knife blades 90 is extended through receiving and rotating assembly 52 so as to be introduced via the alignment grooves (130 in FIG. 14) of nest base 50 to the bent leads of PGA 140. The fully extended knife blades 90 are pivotally supported between oscillator assembly 32 and outboard blade support 56. With oscillator assembly 32 in its forward-most position, the handle bar 7 is located opposite micro switch 12. As earlier described, the user may then push handle bar 7 (as illustrated in phantom and represented by reference numeral 7-1) against the bias of compression spring 24, whereby to engage and momentarily close micro switch 12. The closure of micro switch 12 results in a full 360 degree rotation of eccentric 42. As also earlier described, the rotation of eccentric 42 causes the side-to-side oscillations of track 34 (shown in phantom and designated reference numeral 34-1) and knife blade oscillator assembly 32 (also shown in phantom and represented by reference numeral 32-1). Accordingly, and as illustrated in FIG. 20 of the drawings, the nest of knife blades 90 is likewise oscillated (i.e. rocked back and forth) between respective rows of the leads of PGA 140 to straighten any of such bent leads which are contacted by the knife blades 90.

In FIG. 19, the handle 4 is rotated so that the knife blade oscillator assembly 32 slides to its rear-most position along track 34, and (similar to that described when referring to FIG. 17) the nest of knife blades 90 is fully retracted from PGA receiving and rotating assembly 52. With oscillator assembly 32 now in its rear-most position, the handle bar 7 is located opposite micro switch 14. As earlier described, the user may then push handle bar 7 (as illustrated in phantom and represented by reference numeral 7-2) against the bias of compression spring 24, whereby to engage and momentarily close micro switch 14. The closure of micro switch 14 results in a 90 degree rotation of PGA receiving and rotating assembly 52 and a reorientation of the rows of leads thereof relative to knife blades 90.

The handle 4 is once again rotated so that the knife blade oscillator 32 slides to its forward-most position along track 34 and the method of operation illustrated in FIG. 18 of extending the nest of knife blades 90 for introducing such blades to the bent leads of PGA 140 is repeated. The method of operation illustrated in FIG. 19 is also repeated, whereby PGA receiving and rotating assembly 52 is again rotated 90 degrees. The method of operation illustrated in FIGS. 18 and 19 continues to be repeated until assembly 52 has been rotated, in successive 90 degree increments, a full 360 degrees. The apparatus is then returned to its at-rest condition, as illustrated in FIG. 17, whereupon the PGA 140 is removed from nest base 50. The oscillation of knife blades 90 between the rows of leads of the PGA 140 after each of the successive 90 degree rotations of PGA receiving and rotating assembly 52 will straighten any bent leads, regardless of the angle or direction such leads are bent. Accordingly, once the PGA 140 is removed from the presently disclosed lead straightening apparatus, the leads thereof will be in an identical parallel alignment with one another to enable to relatively quick and easy electrical interconnection between PGA 140 and a test socket, a receptacle, a circuit board, or the like.

It will be apparent that while a preferred embodiment of the invention has been shown and described, various modifications and changes may be made without departing from the true spirit and scope of the invention. Having thus set forth a preferred embodiment of the invention, what is claimed is:

1. Apparatus to straighten the bent leads of a pin grid array, comprising a plurality of elongated blades, a track attached to said apparatus, oscillator assembly means received by said track and movable therealong, said oscillator assembly means retaining said plurality of blades in an alignment so as to permit said blades to be introduced to or retracted from the leads of the pin grid array when said oscillator assembly means moves along said track, means interconnected with said track by which to pivot said track and thereby cause the side-to-side movement of said oscillator assembly means so as to cause said blades to oscillate back and forth between respective rows of said leads to thereby engage and straighten the leads when said plurality of blades are introduced thereto, and means within said apparatus by which to receive a pin grid array having leads to be straightened, said receiving means being rotatable to rotate the pin grid array when said plurality of blades are retracted from the leads thereof, so that said leads can be variably oriented for repeated engagement by said blades.

2. The apparatus recited in claim 1, wherein said plurality of blades are arranged in parallel alignment with one another, first ends of said blades being retained by said oscillator assembly means and second ends of said blades projecting outwardly from and ahead of said oscillator assembly means.

3. The apparatus recited in claim 1, further comprising at least one guide rod extending parallel to said track, carriage assembly means slideably received by said guide rod and movable therealong, and means by which to interconnect said carriage assembly means with said oscillator assembly means so that a movement by said carriage assembly means along said guide rod causes a corresponding movement of said oscillator assembly means along said track.

4. The apparatus recited in claim 3, wherein said carriage assembly means has first and second side plates and at least one support bar extending through said oscillator assembly means and between said side plates, said oscillator assembly means being slideably received by said support bar, such that a side-to-side movement of said oscillator assembly means along said support bar causes a corresponding oscillation of said plurality of blades.

5. The apparatus recited in claim 1, wherein said pivot means interconnected with said track includes a pivot support connected at a first end of said track around which said track may pivot and a rotatable eccentric connected at the other end of said track, the rotation of said eccentric causing said track to pivot around said pivot support.

6. The apparatus recited in claim 5, further comprising a motor interconnected wtih said eccentric for causing said eccentric to rotate and said track to pivot.

7. The apparatus recited in claim 1, wherein said pin grid array receiving and rotating means has an opening formed therein through which the leads of said pin grid array project for engagement by said plurality of blades when said blades are introduced thereto.

8. The apparatus recited in claim 7, further comprising a motor interconnected with said pin grid array receiving and rotating means for causing said receiving and rotating means to rotate when said plurality of blades are retracted from the pin grid array leads.

9. The apparatus recited in claim 8, wherein said receiving and rotating means comprises a table having parallel grooves formed along a face thereof to guide said plurality of blades through respective rows of the pin grid array leads.

10. Apparatus to straighten the bent leads of a pin grid array, comprising:
a plurality of elongated blades;
track means attached to said apparatus;
means to carry said plurality of blades, said blades being pivotally attached at first ends thereof to said carrying means and said carrying means being received by said track means for travel therealong;
means interconnected to said carrying means by which to move said carrying means in a first direction along said track means so as to either introduce second ends of said blades to the leads of the pin grid array of withdraw said blades from the pin grid array leads;
means interconnected with said track means by which to pivot said track means and thereby move said blade carrying means from side-to-side in a second direction transverse to said first direction and oscillate said blades between respective rows of pin grid array leads to engage and straighten the leads when said blades are introduced thereto; and
means attached to said apparatus by which to receive a pin grid array having leads to be straightened, said receiving means aligning the leads for introduction thereto of said blades.

11. The apparatus recited in claim 10, further comprising means interconnected with said pin grid array receiving means by which to rotate said receiving means so that the leads of the pin grid array can be variably oriented for repeated introduction of and engagement by said plurality of blades.

12. The apparatus recited in claim 11, wherein the means by which to oscillate said plurality of blades includes a first motor interfaced with said blades and the means by which to rotate said pin grid array receiving means is a second motor interfaced with said receiving means.

13. The apparatus recited in claim 12, further comprising first and second normally open switch means respectively connected to said first and second motors, and means within said apparatus by which to selectively close either said first switch means and thereby energize said first motor to oscillate said plurality of blades when said blades are introduced to the pin grid array leads or said second switch means and thereby energize said second motor to rotate said pin grid array receiving means when said blades are withdrawn from said leads.

14. The apparatus recited in claim 13, wherein said means to selectively close said first or second switches is a handle connected to said blade carrying means for moving said carrying means along said track, said handle being rotatable between said first and second switches to engage and momentarily close one of said switches depending upon the locations of said carrying means on said track and said plurality of blades relative to the pin grid array leads.

15. The apparatus recited in claim 10, wherein said plurality of blades are arranged in parallel alignment with one another, said first ends of said blades being retained by said blade carrying means and said second ends of said blades projecting outwardly from and ahead of said carrying means.

16. Apparatus to straighten the bent leads of a pin grid array, comprising:

lead straightening station means within said apparatus at which to receive a pin grid array having leads to be straightened;

a plurality of elongated blades aligned with one another along respective parallel axes;

support means for said blades located within said apparatus and operable to support linear movement of said blades from a position outside said lead straightening station means to a position at said lead straightening station means so that said blades are moved between respective rows of pin grid array leads;

means to pivotally attach said blades to said support means so that said blades may pivot about said parallel axes;

rocking means interconnected with said support means and operable to rock said support means back and forth, such that said blades pivot between the respective rows of pin grid array leads at said lead straightening station means to thereby engage and straighten said leads;

rotating means interconnected with said lead straightening station means and operable to rotate said station means so that the leads of the associated pin grid array can be variably oriented for successive introduction of and engagement by said plurality of blades; and actuating means connected to each of said rocking means and said rotating means and responsive to the linear position of said support means relative to said lead straightening station means for selectively operating one or the other of said rocking means or said rotating means, said actuating means operating said rocking means to pivot said plurality of blades when said support means moves said blades into engagement with said pin grid array leads or operating said rotating means to rotate said pin grid array lead straightening station means when said support means withdraws said blades from said leads.

17. The apparatus recited in claim 16, wherein said actuating means includes a motor means electrically connected to each of said rocking means and said rotating means, normally open switch means respectively connected between each of said motor means and a source of electrical supply, and means to selectively close one of said switch means and thereby energize one of said motor means to operate either of said rocking means to pivot said plurality of blades or said rotating means to rotate said lead straightening station means.

* * * * *